United States Patent
Wong et al.

(10) Patent No.: US 7,124,049 B2
(45) Date of Patent: Oct. 17, 2006

(54) METHOD FOR IMPLEMENTING TRL CALIBRATION IN VNA

(75) Inventors: Kenneth H. Wong, Santa Rosa, CA (US); David V. Blackham, Santa Rosa, CA (US); James C. Liu, Santa Rosa, CA (US); Keith F. Anderson, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 56 days.

(21) Appl. No.: 11/028,159

(22) Filed: Jan. 3, 2005

(65) Prior Publication Data

US 2006/0161369 A1    Jul. 20, 2006

(51) Int. Cl.
  *G06F 19/00* (2006.01)
(52) U.S. Cl. ..................................................... 702/107
(58) Field of Classification Search .................. 702/107
  See application file for complete search history.

(56) References Cited

U.S. PATENT DOCUMENTS

| | | | |
|---|---|---|---|
| 6,300,775 B1 | 10/2001 | Peach et al. | |
| 6,417,674 B1 | 7/2002 | Rowell, Jr. et al. | |
| 6,496,785 B1 | 12/2002 | Nakayama et al. | |
| 6,643,597 B1* | 11/2003 | Dunsmore | |
| 6,836,743 B1 | 12/2004 | Blackham et al. | |
| 7,019,536 B1* | 3/2006 | Anderson et al. | 324/601 |
| 2004/0160228 A1 | 8/2004 | Jamneala et al. | |

OTHER PUBLICATIONS

GB Search Report dated Mar. 28, 2006.
European Search Report issued for GB0524680.6, dated Mar. 28, 2006, 1 page.

* cited by examiner

*Primary Examiner*—Michael Nghiem
*Assistant Examiner*—Tung S Lau

(57) ABSTRACT

In one embodiment, a method comprises storing parameters that are related to switch error correction terms of a vector network analyzer (VNA), and applying a calibration process of a TRL group of calibration processes to the VNA to generate calibration measurements, wherein the calibration process generates calibration measurements, calculates a switch error correction matrix using the stored parameters and a subset of the calibration measurements, and applies the switch error correction matrix to calibration measurements before solving for eight-systematic error terms associated with the calibration process.

19 Claims, 3 Drawing Sheets

METHOD FOR IMPLEMENTING TRL CALIBRATION IN VNA

TECHNICAL FIELD

The present application is generally related to calibration of a vector network analyzer (VNA).

BACKGROUND

FIG. 1 depicts VNA 100 according to a conventional design. As shown in FIG. 1, VNA 100 comprises switch 101 to switch between VNA ports A through D to establish a path to a single reference receiver 102. When the RF signal path switch 101 changes position, the termination of the test port also changes. The change in termination causes the source match term to be different from the load match term. In a multiport VNA (more than two test ports), it is possible that each test port has multiple different load match terms. During calibration, each of the load match terms needs to be characterized and treated in the same manner as a two-port VNA. The difference between source and load match is referred to as the "switch error." The standard 12-term VNA error model (or multiport equivalent) derives the load match term from the through connection.

The TRL family or group of calibrations is based on the 8-term error model which only factors in a single match term at each testport. The TRL family usually requires two receivers for each test port to factor out any port match variation through additional measurements and to obtain the necessary data to determine the VNA's systematic error terms. The TRL family of calibrations includes all calibration algorithms that are based on having a constant match defined for each test port independent of switching. The TRL family includes but is not limited to TRL, TRM, LRL, LRM, and Unknown Thru algorithms. Subsequent references to TRL calibration as used herein applies to the entire family of calibration and not to a specific algorithm. Because two receiver requirement, the traditional TRL calibration method cannot be applied to VNA 100. To address this issue, a two-tier calibration process has been developed. In the two-tier process, the short, open, load, through (SOLT) calibration method is initially performed to obtain the switch error correction terms. After the initial calibration and with error correction turned "on," the second tier is performed by applying the TRL calibration process. The multi-tier calibration essentially doubles the amount of time required to calibrate a VNA as compared to the calibration time associated with a VNA having a reference receiver for each port.

SUMMARY

Some representative embodiments enable calibration procedures to be applied to a VNA that only possesses a single reference receiver in an efficient manner. In some representative embodiments, a SOLT calibration is performed as an initial calibration tier. The SOLT calibration is used to calculate parameters associated with the switch error correction terms of the VNA. The calculated parameters are stored. Upon subsequent re-calibration of the VNA, some representative embodiments omit the necessity of repeating the SOLT calibration tier. In particular, some representative embodiments proceed directly to the TRL calibration process. A switch error correction matrix is calculated using the stored parameters and the measurement data from the TRL calibration process. The switch error correction matrix is applied to the measurement data and the error terms are calculated.

DETAILED DESCRIPTION

Figure 1:
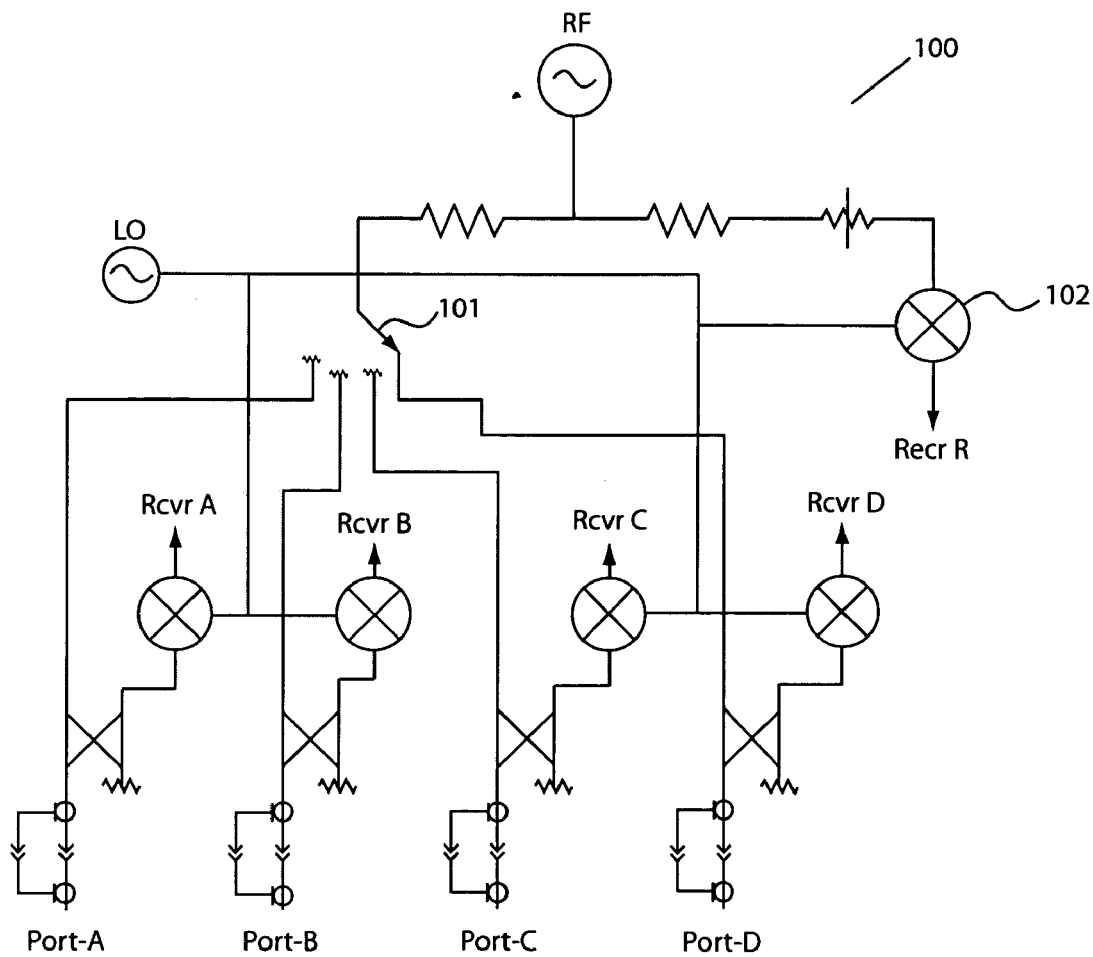
FIG. 1 depicts a single reference receiver VNA according to a conventional design.
Figure 2:
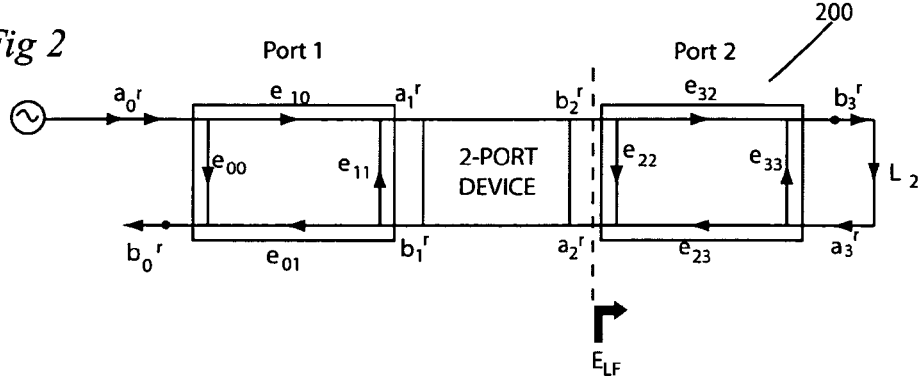
FIGS. 2 and 3 depict forward and reverse eight-error term models.

To facilitate the discussion of the mathematical basis associated with some representative embodiments, the 8-term error model 200 is shown in FIG. 2. Given a VNA with two receivers per test port that can measure the incident and reflected signals, when the switch is placed in the forward position and power is applied to the port-1 side, the following equations are obtained:

$$b_0^f = S_{11m}a_0^f + S_{12m}a_3^f$$

$$b_3^f = S_{12m}a_0^f + S_{22m}a_3^f \quad (1)$$

Figure 3:
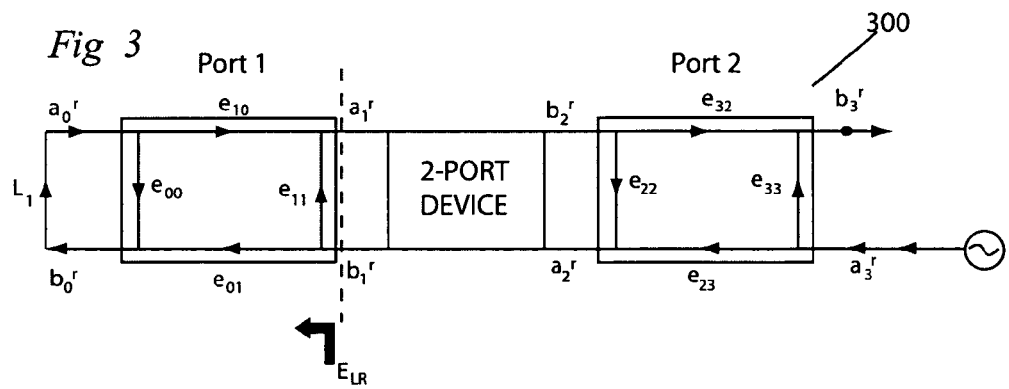

FIG. 3 depicts the eight-term error model 300 where power is applied to the port-2 side. When power the switch is placed in the reverse side and power is applied to the port-2 side, the following equations are obtained:

$$b_3^r = S_{21m}a_0^r + S_{22m}a_3^r$$

$$b_0^r = S_{11m}a_0^r + S_{12m}a_0^r \quad (2)$$

Because the system is not perfect, caused by $L_1$ and $L_2$, the $a_3^f$ and $a_0^r$ terms are not zero and must be addressed. Re-arranging equations (1) and (2) into the following form:

$$\frac{b_0^f}{a_0^f} = S_{11m} + S_{12m}\frac{a_3^f}{a_0^f} \quad (3)$$

$$\frac{b_0^r}{a_3^r} = S_{11m}\frac{a_0^r}{a_3^r} + S_{12m}$$

$$\frac{b_3^f}{a_0^f} = S_{21m} + S_{22m}\frac{a_3^f}{a_0^f}$$

$$\frac{b_3^r}{a_3^r} = S_{21m}\frac{a_0^r}{a_3^r} + S_{22m}$$

$$[S_R] = \begin{bmatrix} \frac{b_0^f}{a_0^f} & \frac{b_0^r}{a_3^r} \\ \frac{b_3^f}{a_0^f} & \frac{b_3^r}{a_3^r} \end{bmatrix} = \begin{bmatrix} S_{11R} & S_{12R} \\ S_{21R} & S_{22R} \end{bmatrix}$$

Let $$[S_m] = \begin{bmatrix} S_{11m} & S_{12m} \\ S_{21m} & S_{22m} \end{bmatrix}; \quad (4)$$

$$[M_{sc}] = \begin{bmatrix} 1 & \frac{a_0^r}{a_3^r} \\ \frac{a_3^f}{a_0^f} & 1 \end{bmatrix} = \begin{bmatrix} 1 & L_r \\ L_f & 1 \end{bmatrix}$$

Then $$[S_R] = [S_m] * [M_{sc}] \text{ and } [S_m] = [S_R] * [M_{sc}]^{-1} \quad (5)$$

Solving equation (5) results as follows:

$$S_{11m} = \frac{\frac{b_0^f}{a_0^f} - \frac{b_0^r}{a_3^r}\frac{a_3^f}{a_0^f}}{\Delta} \quad (6)$$

$$S_{12m} = \frac{\frac{b_0^r}{a_3^r} - \frac{b_0^f}{a_0^f}\frac{a_0^r}{a_3^r}}{\Delta}$$

$$S_{21m} = \frac{\frac{b_3^f}{a_0^f} - \frac{b_3^r}{a_3^r}\frac{a_3^f}{a_0^f}}{\Delta}$$

$$S_{22m} = \frac{\frac{b_3^r}{a_3^r} - \frac{b_3^f}{a_0^f}\frac{a_0^r}{a_3^r}}{\Delta}, \text{ where } \Delta = 1 - \frac{a_3^f}{a_0^f}\frac{a_0^r}{a_3^r}$$

It is noted that two extra measurements $a_3^f$ and $a_0^r$ are used to solve $[S_m]$. However, for a VNA with only one reference receiver, these terms cannot be determined.

To solve the switch error correction terms from a different perspective, the $L_f$ and $L_r$ terms can be rewritten as follows:

$$L_r = \frac{a_0^r}{a_3^r} = \frac{b_0^r}{a_3^r}\frac{a_0^r}{b_0^r} = S_{12m}L_1; \quad (7)$$

$$L_1 = \frac{a_0^r}{b_0^r}$$

$$L_f = \frac{a_3^f}{a_0^f} = \frac{b_3^f}{a_0^f}\frac{a_3^f}{b_3^f} = S_{21m}L_2;$$

$$L_2 = \frac{a_3^f}{b_3^f}$$

Equation (7) can be substituted back into equation (6) as follows (this method is equivalent to adding an imperfect termination to the respective error box):

$$S_{11m} = \frac{\frac{b_0^f}{a_0^f} - \frac{b_0^r}{a_3^r}\frac{b_3^f}{a_0^f}L_2}{\Delta'} \quad (8)$$

$$S_{12m} = \frac{\frac{b_0^r}{a_3^r} - \frac{b_0^f}{a_0^f}\frac{b_0^r}{a_3^r}L_2}{\Delta'}$$

$$S_{21m} = \frac{\frac{b_3^f}{a_0^f} - \frac{b_3^r}{a_3^r}\frac{b_3^f}{a_0^f}L_2}{\Delta'}$$

$$S_{22m} = \frac{\frac{b_3^r}{a_3^r} - \frac{b_3^f}{a_0^f}\frac{b_0^r}{a_3^r}L_1}{\Delta'}, \text{ where } \Delta' = 1 - L_1L_2\frac{b_3^f}{a_0^f}\frac{b_0^r}{a_3^r}$$

If $L_1$ and $L_2$ can be determined and saved, the values can be retrieved and used in equation (6). From FIGS. 2 and 3, the following equations may be derived:

$$E_{LF} = e_{22} + \frac{e_{32}e_{33}L_2}{1 - e_{33}L_2} \quad (9)$$

$$E_{LR} = e_{11} + \frac{e_{10}e_{01}L_1}{1 - e_{00}L_1}$$

Solving for $L_2$ and $L_1$ gives:

$$L_2 = \frac{E_{LF} - e_{22}}{e_{32}e_{23} + e_{33}(E_{LF} - e_{22})} \quad (10)$$

$$L_1 = \frac{E_{LR} - e_{11}}{e_{10}e_{01} + e_{00}(E_{LR} - e_{11})}$$

Comparing equation (8) to equation (6), it is seen that:

$$a_3^f = b_3^f L_2 \text{ and } a_0^r = b_0^r L_1 \quad (11)$$

Based upon the preceding mathematical derivations, it is observed that the parameters $L_1$ and $L_2$ can be determined using a calibration process based upon the twelve term error model (e.g., the SOLT method). In VNAs with dual reflectometers at each port, $a_3^f$ and $a_0^r$ are directly measured. In VNA systems without dual reflectometers, the terms $a_3^f$ and $a_0^r$ cannot be determined directly by calibration methods that use the eight term error model. However, if a VNA is sufficiently stable with time and temperature, it may be assumed that the parameters $L_1$ and $L_2$ will remain relatively constant (at least over the "short" term). Accordingly, instead of directly measuring the terms $a_3^f$ and $a_0^r$ upon each calibration, these terms can be calculated from the terms $b_3^f$ and $b_0^r$ and the parameters $L_1$ and $L_2$.

Figure 4:
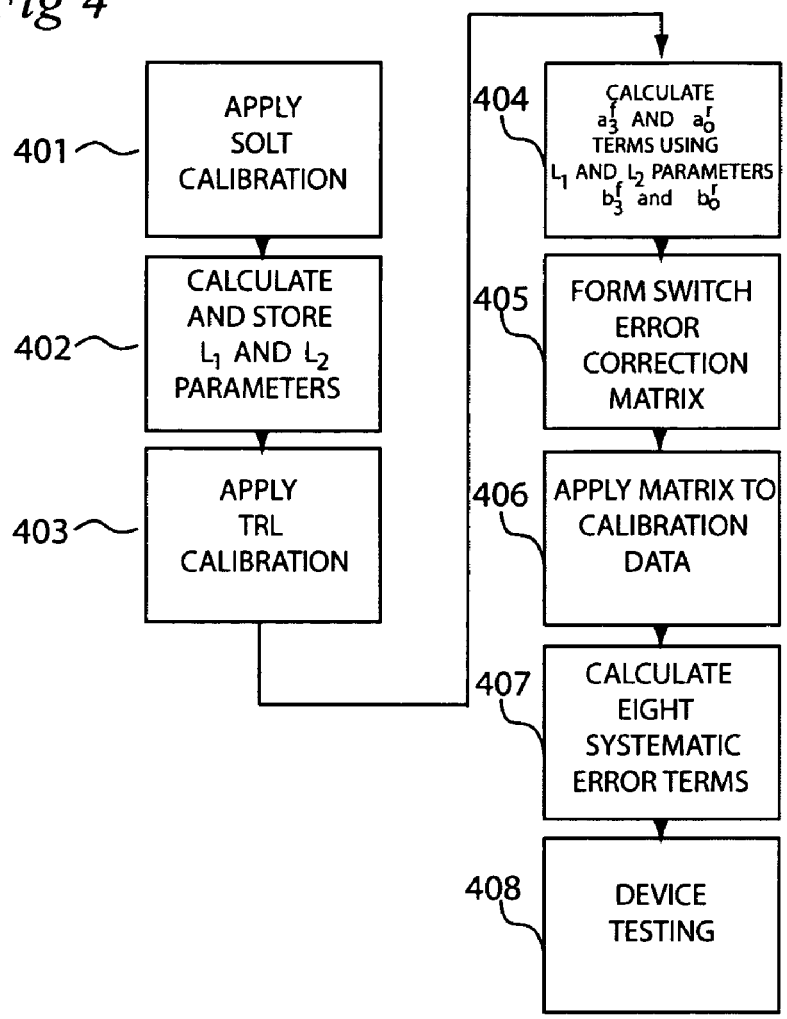
FIG. 4 depicts a flowchart including calibration operations performed on a VNA having only one reference receiver according to one representative embodiment.

In view of the ability to accurately estimate the terms $a_3^f$ and $a_0^r$ using stored parameters, an efficient method of calibrating a VNA having only one reference receiver can be achieved as shown in FIG. 4. The portions of the flowchart of FIG. 4 may be implemented using suitable logic (e.g., software or integrated circuitry) on a VNA or an associated processing platform (e.g., a personal computer). This is also applicable to a VNA with more than one reference receiver. Some reference receiver designs do not measure the $a_3^f$ and $a_0^r$ terms correctly.

In step 401, a calibration method (e.g., the SOLT method) based upon the twelve error term model is applied to a VNA. In step 402, the parameters $L_1$ and $L_2$, as defined above, are calculated and stored.

In step 403, a TRL calibration is performed to generate calibration data. In step 404, a switch error correction matrix is formed using the calculated terms $a_3^f$ and $a_0^r$. In step 405, the switch error correction matrix is formed and, in step 406, the switch error correction matrix applied to the calibration data. In step 407, the corrected calibration data is then used to calculate the eight systematic error terms using standard TRL techniques. In step 408, device testing occurs using the calibrated VNA.

In some embodiments, the SOLT calibration process is repeated from time to time to maintain long term accuracy of the stored parameters $L_1$ and $L_2$. Additionally, the stored parameters $L_1$ and $L_2$ preferably include sufficient data points to reduce interpolation errors.

Figure 5:
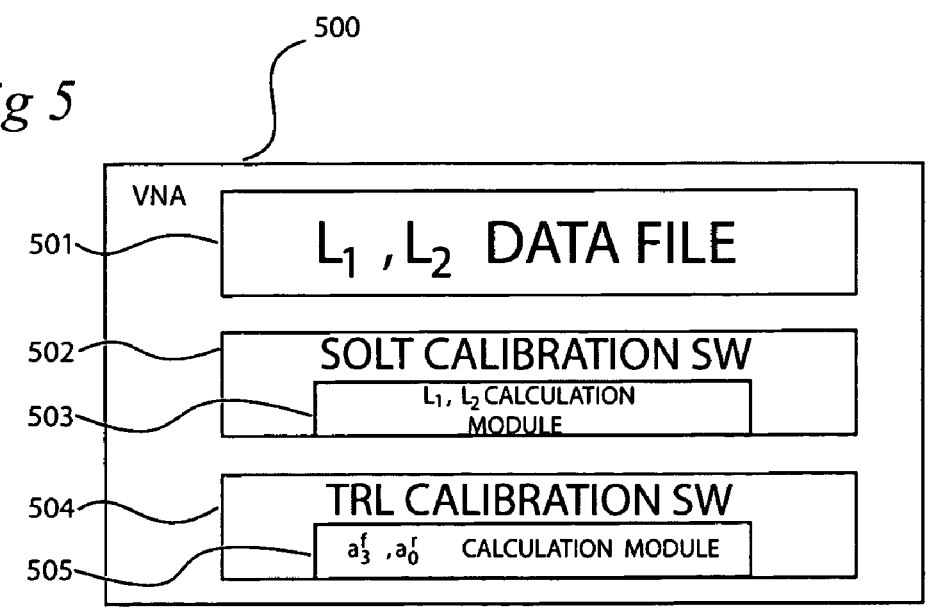
FIG. 5 depicts a VNA according to one representative embodiment.

FIG. 5 depicts VNA 300 according to one representative embodiment. VNA 500 that includes a minimum of one reference receiver. VNA 500 comprises SOLT calibration software 502 that calculates parameters $L_1$ and $L_2$ and stores the parameters in data file 501. VNA 500 further includes TRL calibration software 304 that calculates terms $a_3^f$ and $a^{0r}$ using data file 501, generates a switch error correction matrix, and calculates eight systematic error terms using switch error corrected calibration data. Preferably, TRL calibration software 304 performs interpolation of parameters $L_1$ and $L_2$ for frequencies not explicitly represented in data file 501. Although software is shown in FIG. 5 to perform calibration operations, other suitable logic could alternatively be employed such as integrated circuitry.

What is claimed is:

1. A vector network analyzer (VNA), comprising:
    logic for calculating parameters that are related to switch error correction terms of said VNA from data obtained during a first calibration process that uses a twelve-term error model;
    a data file for storing said parameters; and
    logic for calculating eight-systematic error terms of said VNA using a second calibration process of a TRL group of calibrations, wherein said second calibration process generates calibration measurements, calculates a switch error correction matrix using said stored parameters and a subset of said calibration measurements, and applies said switch error correction matrix to calibration measurements before calculation of said eight-systematic error terms.

2. The VNA of claim 1 wherein said parameters are derived from the short, open, load, through (SOLT) calibration process.

3. The VNA of claim 1 wherein said subset of said calibration measurements includes a $b_3^f$ measurement of an eight term error model.

4. The VNA of claim 1 wherein said subset of said calibration measurements includes a $b_0^r$ measurement of an eight term error model.

5. The VNA of claim 1 wherein calculation of said switch error correction matrix comprises interpolating points associated with frequencies not represented in said stored parameters.

6. The VNA of claim 1 wherein said solving for eight-systematic error terms comprises determining a first error matrix associated with a first port of said VNA and a second error matrix associated with a second port of said VNA.

7. A method, comprising:
    storing parameters that are related to switch error correction terms of a vector network analyzer (VNA); and
    applying a calibration process of a TRL group of calibrations to said VNA to generate calibration measurements, wherein said calibration process generates calibration measurements, calculates a switch error correction matrix using said stored parameters and a subset of said calibration measurements, and applies said switch error correction matrix to calibration measurements before solving for eight-systematic error terms associated with said calibration process.

8. The method of claim 7 wherein said parameters are derived from a calibration process based on a twelve term error model.

9. The method of claim 7 wherein said parameters are derived from the short, open, load, through (SOLT) calibration process.

10. The method of claim 7 wherein said subset of said calibration measurements includes a $b_3^f$ measurement of an eight term error model.

11. The method of claim 7 wherein said subset of said calibration measurements includes a $b_0^r$ measurement of an eight term error model.

12. The method of claim 7 wherein calculation of said switch error correction matrix comprises interpolating points associated with frequencies not represented in said stored parameters.

13. The method of claim 7 wherein said solving for eight-systematic error terms comprises determining a first error matrix associated with a first port of said VNA and a second error matrix associated with a second port of said VNA.

14. A vector network analyzer (VNA), comprising:
    means for calculating parameters that are related to switch error correction terms of said VNA from data obtained during a first calibration process that uses a twelve-term error model;
    means for storing said parameters; and
    means for generating calibration measurements using a second calibration process from a TRL group of calibration processes;
    means for calculating a switch error correction matrix using said stored parameters and a subset of said calibration measurements;
    means for applying said switch error correction matrix to said calibration measurements; and
    means for calculating eight systematic error terms of said VNA using said switch error corrected calibration measurements.

15. The VNA of claim 14 wherein said parameters are derived from the short, open, load, through (SOLT) calibration process.

16. The VNA of claim 14 wherein said subset of said calibration measurements includes a $b_3^f$ measurement of an eight term error model.

17. The VNA of claim 14 wherein said subset of said calibration measurements includes a $b_0^r$ measurement of an eight term error model.

18. The VNA of claim 14 wherein means for calculating said switch error correction matrix interpolates points associated with frequencies not represented in said stored parameters.

19. The VNA of claim 14 wherein means for calculating eight systematic error terms determines a first error matrix associated with a first port of said VNA and a second error matrix associated with a second port of said VNA.

* * * * *

UNITED STATES PATENT AND TRADEMARK OFFICE
CERTIFICATE OF CORRECTION

PATENT NO.        : 7,124,049 B2  
APPLICATION NO. : 11/028159  
DATED             : October 17, 2006  
INVENTOR(S)       : Wong et al.

It is certified that error appears in the above-identified patent and that said Letters Patent is hereby corrected as shown below:

On the title page, item (56), under "U.S. Patent Documents", in column 2, line 3, after "Dunsmore" insert -- 702/104 --.

In column 5, line 51, in Claim 7, after "generates" insert -- said --.

In column 5, line 55, in Claim 7, after "to" insert -- said --.

In column 5, line 57, in Claim 7, delete "process." and insert -- process; and calibrating said VNA with results of said applying --, therefor.

Signed and Sealed this

Twentieth Day of February, 2007

JON W. DUDAS  
*Director of the United States Patent and Trademark Office*